United States Patent
Kim et al.

(10) Patent No.: US 9,245,619 B2
(45) Date of Patent: Jan. 26, 2016

(54) MEMORY DEVICE WITH MEMORY BUFFER FOR PREMATURE READ PROTECTION

(71) Applicant: International Business Machines Corporation, Armonk, NY (US)

(72) Inventors: Kyu-hyoun Kim, Mount Kisco, NY (US); SangBum Kim, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 14/197,201

(22) Filed: Mar. 4, 2014

(65) Prior Publication Data

US 2015/0255150 A1    Sep. 10, 2015

(51) Int. Cl.
  *G11C 11/00* (2006.01)
  *G11C 13/00* (2006.01)

(52) U.S. Cl.
  CPC .......... *G11C 13/004* (2013.01); *G11C 13/0004* (2013.01); *G11C 13/0064* (2013.01); *G11C 13/0069* (2013.01)

(58) Field of Classification Search
  CPC ............... G11C 16/3481; G11C 16/10; G11C 16/0466; G11C 16/3418; G11C 11/5628; G11C 16/28; G11C 16/06; G11C 16/24; G11C 7/22; G11C 11/4076; G11C 7/1051; G11C 11/4096; G11C 7/10; G11C 7/1078; G11C 16/26; G11C 13/0061; G11C 8/12
  See application file for complete search history.

(56) References Cited

U.S. PATENT DOCUMENTS

| | | |
|---|---|---|
| 2009/0276559 A1 | 11/2009 | Allen, Jr. et al. |
| 2010/0023559 A1 | 1/2010 | McKenney et al. |
| 2011/0035540 A1 | 2/2011 | Fitzgerald et al. |
| 2011/0055486 A1* | 3/2011 | Heo ............. G06F 12/0868 711/128 |
| 2012/0144129 A1 | 6/2012 | McKenney |

FOREIGN PATENT DOCUMENTS

| | | |
|---|---|---|
| CN | 101178942 A | 5/2008 |
| JP | 09247349 A | 9/1997 |
| WO | WO 0122426 A1 | 3/2001 |

OTHER PUBLICATIONS

Sato, Takayuki, Kazuhiko Ohno, et al; "A mechanism for speculative memory accesses following synchronizing operations." In Parallel and Distributed Processing Symposium, 2000. IPDPS 2000. Proceedings. 14th International, pp. 145-154. IEEE, 2000.
Tetrault, M-A. et al; "Real time coincidence detection engine for high count rate timestamp based PET."Nuclear Science, IEEE Transactions on 57, No. 1 (2010): 117-124.

* cited by examiner

*Primary Examiner* — Hien Nguyen
(74) *Attorney, Agent, or Firm* — Ido Tuchman; Louis J. Percello (57) ABSTRACT

Devices and methods for accurate reading of data in memory technology prone to drifting memory characteristics. An example device includes a memory array for storing data, and a memory buffer for storing a subset of the data in the memory array. A memory controller is configured to read data from the memory buffer if the data was written to the memory array before a predetermined duration of time, and to read the data from the memory array if the data is at least one of not valid or not available at the memory buffer.

20 Claims, 10 Drawing Sheets

MEMORY DEVICE WITH MEMORY BUFFER FOR PREMATURE READ PROTECTION

BACKGROUND

The present invention relates to computer memory devices. More particularly, the present invention relates to management of memory devices with drifting electrical characteristics.

Typical memory devices consist of memory cells fabricated with semiconductor materials. As memory device size continues to scale down and with the continuing drive to maintain low power consumption in memory devices, many issues arise from the limitations of the materials and their electrical properties. One such issue is the drifting of electrical characteristics utilized for reading memory states. An example of drifting read characteristics is the tendency of electric charge leakage in a capacitor memory cell.

Another example is resistance drift in phase change memory (PCM) technology. Conventionally, PCM read operations measure resistance level to distinguish memory states. The resistance levels in PCM cells have a tendency to increase over time, after programming. The resistance drift makes reading the stored data from a PCM cell challenging because resistance contrast between two adjacent (in terms of resistance levels) memory states is gradually reduced over time, and resistance of different memory states may eventually overlap.

Additionally, multi-level cell (MLC) memory technology has been employed to increase data density in memory devices. MLC memory arrays incorporate memory cells with the advantage of storing two or more digit binary values, as opposed to the traditional single-level cell (SLC) memory that stores a single digit binary value. However, resistance drift is more problematic when a PCM cell is configured with a MLC scheme than a SLC scheme because the resistance margins between neighboring resistance levels are greatly reduced in MLC.

BRIEF SUMMARY

An aspect of the present invention is a memory device with a premature read protection scheme. The memory device includes a memory array including a plurality of memory cells configured to store data. The memory device also includes a memory buffer configured to store a subset of the data in the memory array. A memory controller is configured to read data from the memory buffer if the data was written to the memory array before a predetermined duration of time. The memory controller is further configured to read the data from the memory array if the data is either not valid or not available at the memory buffer.

Another aspect of the present invention is a method for operating a memory device. The method includes writing data to a memory array and a memory buffer. The memory array is configured to store data in a plurality of memory cells and the memory buffer is configured to store a subset of the data in the memory array. The method includes reading data from the memory buffer if the data was written to the memory array before a predetermined duration of time. The method also includes reading data from the memory array if the data is either not valid or not available at the memory buffer.

DETAILED DESCRIPTION

It is initially noted that the environments described below and depicted in the figures are for the purpose of illustrating suggested embodiments of the present invention. Therefore, the present invention encompasses alternative orientations and configurations of the suggested embodiments.

Throughout the description of the invention reference is made to FIGS. 1-9. When referring to the figures, like structures and elements shown throughout are indicated with like reference numerals. Throughout the description, the terms predetermined duration of time and premature read protection time (tPRP) are to be interpreted as equivalent in meaning.

Figure 1:
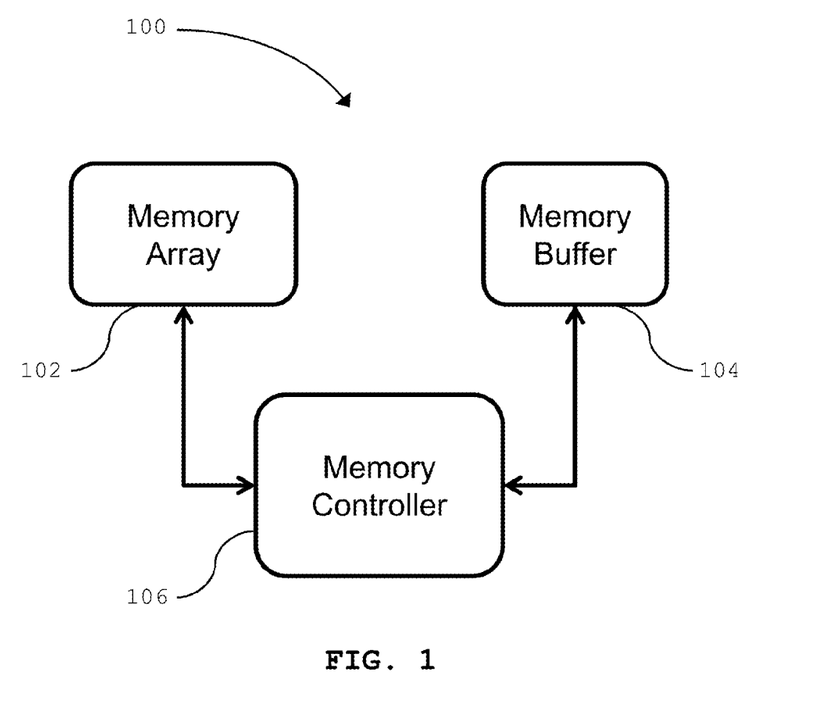
FIG. 1 is a simplified block diagram illustrating a memory device according to one embodiment of the present invention.

FIG. 1 is a simplified block diagram illustrating a memory device 100 according to one embodiment of the present invention. The memory device 100 includes a memory array 102, memory buffer 104, and memory controller 106. The memory device 100 includes a premature read protection scheme, wherein the memory controller 106 is configured to read data from the memory buffer 104 if the data was written to the memory array 102 before a predetermined duration of time, and to read the data from the memory array 102 if the data is not valid or unavailable at the memory buffer 104.

The memory array 102 may be comprised of any number of memory technologies prone to read variable drift, such as phase change memory (PCM) or other resistive memory technologies, such as metal oxide resistive switching random access memory (Metal-Oxide PRAM), conductive bridge memory (CBRAM), and magnetic random access memory (MRAM). The memory buffer 104 may be comprised of any number of memory technologies. In some embodiments, the memory buffer 104 is comprised of a memory technology less prone to read variable drift than the memory array 102. For example, the memory array 102 may be comprised of an array of PCM cells in a multi-level cell (MLC) scheme and the memory buffer 104 may be comprised of an array of PCM cells in a single-level cell (SLC) scheme.

Figure 2:
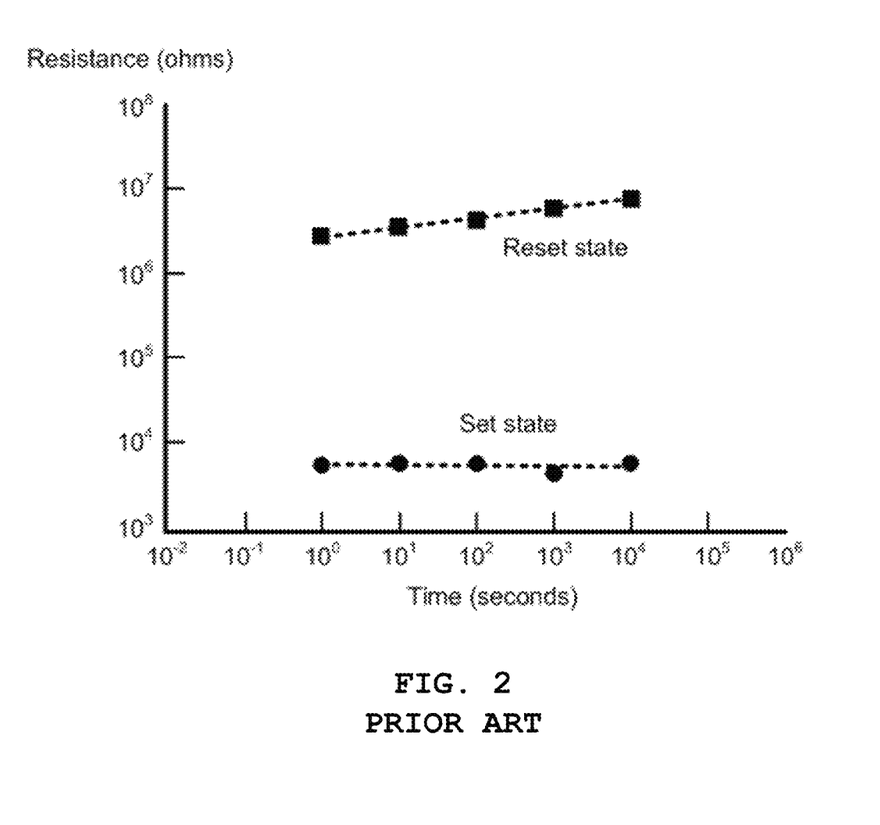
FIG. 2 is a graph illustrating an example of resistance change over time in a PCM cell.

FIG. 2 is a graph illustrating an example of resistance change over time in a PCM cell. The graph shows the resistance for the reset state (amorphous state in this example) and for the set state (crystalline state in this example). The increase in resistance for PCM cells, over time after programming, can be modeled with the formula $R(t)=R_0*(t/t_0)^\gamma$. Wherein R denotes resistance, t denotes time, and γ denotes the drift coefficient. In most phase change materials, the drift coefficient is greater in the amorphous phase (reset state) than in the crystalline phase (set state). See D. Ielmini et al., "Physical interpretation, modeling and impact on phase change memory (PCM) reliability of resistance drift due to chalcogenide structural relaxation", IEEE International Electron Devices Meeting, pp. 939-942 (2007).

Figure 3A:
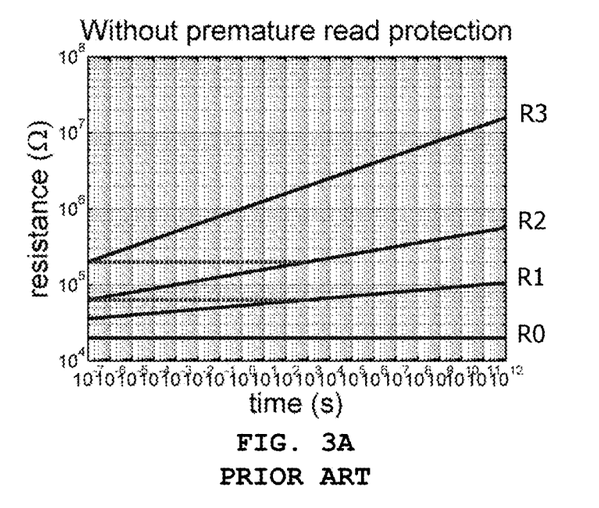
FIG. 3A is a graph illustrating an example of resistance change over time in a PCM array without a premature read protection scheme.

FIG. 3A is a graph illustrating an example of resistance change over time in a PCM array without a premature read protection scheme. The resistance and time are graphed on a logarithmic scale. The PCM array includes four resistance levels (R0-R3) associated with array read thresholds. In this example, a memory cell is written at time 0. As illustrated by the dotted horizontal lines, by approximately 1000 seconds after writing a cell, the resistance R1 has drifted to the initial resistance of R2. Furthermore, resistance R2 has drifted to the initial resistance of R3. Accordingly, a conventional fixed threshold would be rendered ineffective after approximately 1000 seconds.

Figure 3B:
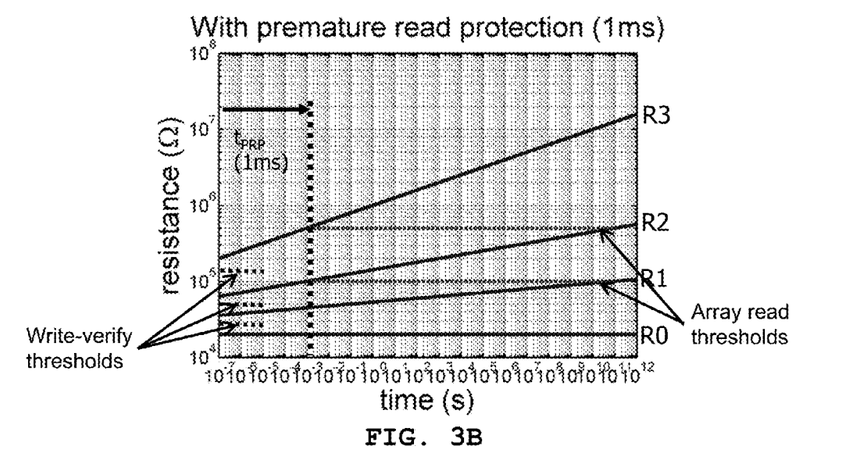
FIG. 3B is a graph illustrating an example of resistance change over time in a PCM array with a premature read protection scheme, according to one embodiment of the present invention.

FIG. 3B is a graph illustrating an example of resistance change over time in a PCM array with a premature read protection scheme contemplated by the present invention. The resistance and time are graphed on a logarithmic scale. The PCM array includes four resistance levels (R0-R3) associated with array read thresholds. In this example, a memory cell is written at time 0, while the premature read protection time (tPRP) is configured as $10^{-3}$ seconds (1 ms). That is, data that has been written in the memory array 102 for less than tPRP, is read from the memory buffer 104 instead of the memory array 102. As illustrated by the dotted horizontal lines to the right of tPRP, the resistance of R1 takes approximately 80 billion seconds (approximately 2,500 years) to drift to R2 at tPRP. It also takes approximately equal time for R2 to drift to R3 at tPRP.

Additionally, in a memory device 100 may include a write-verify scheme, wherein data is read after being written and rewritten to the memory array 102 until it fulfills write-verify thresholds. The write-verify thresholds may be less than the corresponding array read thresholds. The write-verify thresholds, as illustrated by the dotted horizontal lines to the left of tPRP, are configured to sense resistance levels within time interval tPRP. One skilled in the art would recognize that write-verify threshold circuitry may be integrated with the array read threshold circuitry in the memory array 102. Selection of which thresholds to utilize for sensing may be achieved by sending different signals to a sense amplifier integrated in the read circuitry during write-verify operations.

Figure 4:
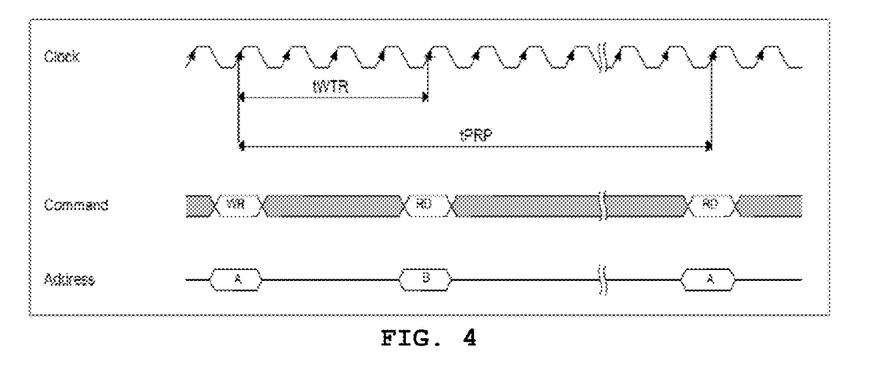
FIG. 4 is a timing diagram illustrating a clock cycle for PCM read and write operations.

FIG. 4 is a timing diagram illustrating a clock cycle for PCM protocol for read and write operations. Along the clock cycle, interval tWTR (write-to-read delay time) indicates the time interval between a write command and a read command. In this example, address B may be any address other than address A. In conventional memory device operations, tWTR is the minimum time between a write command to address A and a read command issued to address B. In a conventional memory array prone to drifting electrical characteristics, tPRP is the minimum time between a write command to a first address and a read command issued to the same address. Theoretically, in a memory device 100 with a premature read protection scheme, the minimum time between a write and read command to the same address may be reduced to tWTR.

Figure 5:
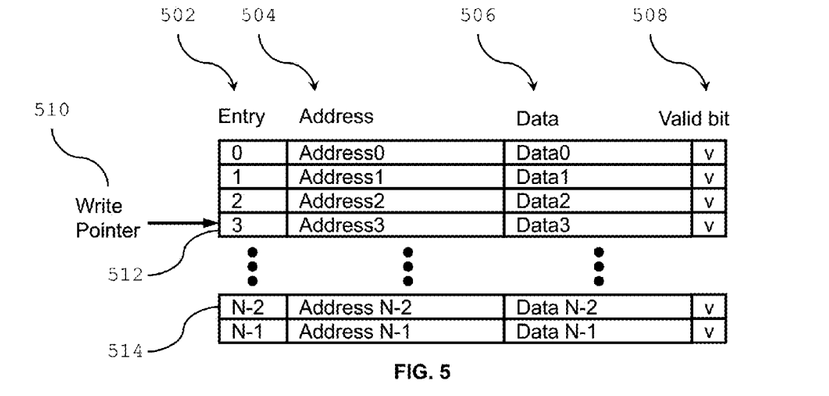
FIG. 5 shows an example configuration of a memory buffer according to one embodiment of the present invention.

FIG. 5 shows a memory buffer 104 according to one embodiment of the present invention. The memory buffer 104 includes a plurality of entries 502. Each entry of the memory buffer 104 includes a data address 504 in the memory array 102, data 506 stored at the address, and a validation bit 508 indicating if the entry contains valid information. The memory buffer 104 also includes a write pointer 510 identifying a current entry 512 in the memory buffer. The current entry 512 is the entry where the memory controller 106 writes data from the memory array 102. After each write to the current entry, the write pointer 510 may be incremented to a next entry. In this example, the write pointer 510 is currently indicating entry 3 as the current entry 512. After a write operation to current entry 512 (entry 3), the write pointer will increment to entry 4.

Additionally, the memory buffer 104 may be a circular buffer, such that after writing a current entry at index N−1, the write pointer 510 is incremented to the next entry at index 0. In such an embodiment, the memory buffer 104 has a size of N. In one embodiment, N is at least the maximum number of writes within tPRP, as represented in the following formula: N>=[tPRP/write-cycle-time]*M, where M is equal to the maximum number of concurrent writes. Write-cycle-time may be equal to tWTR and M may be the number of cells in the memory array 102. In one embodiment, the memory array 102 is comprised of phase change memory technology, and N is configured based on the amount of resistance drift.

Figure 6A:
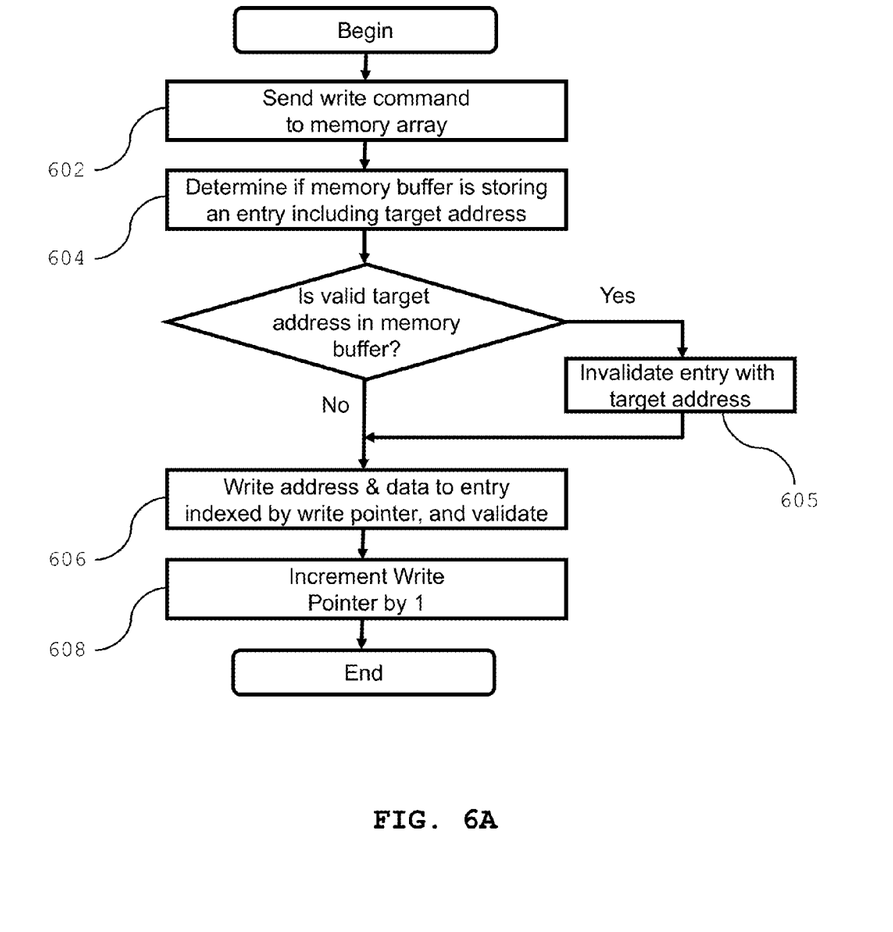
FIG. 6A is a flowchart illustrating a method for writing data in a memory device according to one embodiment of the present invention.

FIG. 6A is a flowchart illustrating a method for writing data in a memory device according to one embodiment of the present invention. The method begins with sending step 602. At sending step 602, the memory controller 106 sends a write command to the memory array 102. The memory array 102 writes target data to a target address in the memory array. In some embodiments, the memory array 102 is configured with a write-verify scheme (described below and in FIG. 8). After sending step 602, the method continues to determining step 604.

At determining step 604, the memory controller 106 determines if the memory buffer 104 is storing an entry including the target address which is valid. If a valid entry including the target address exists in the memory buffer 104, the method continues to invalidating step 605. If no valid entries in the memory buffer 104 include the target address, the method continues to writing step 606.

At invalidating step 605, the entry including the target address is invalidated. For example, the valid bit associated with the target address may be switched to an invalid state. After invalidating step 605, the method continues to writing step 606.

At writing step 606, the target address and target data are written to the current entry indicated by the write pointer 510. The current entry may also be marked as valid. For example, the valid bit associated with the target address may be switched to a valid state. After writing step 606, the method continues to incrementing step 608.

At incrementing step 608, the write pointer 510 is incremented from the current entry to the next entry. In some embodiments, the write pointer is reset after being incremented beyond the last buffer entry. After incrementing step 608, the method is complete.

Figure 6B:
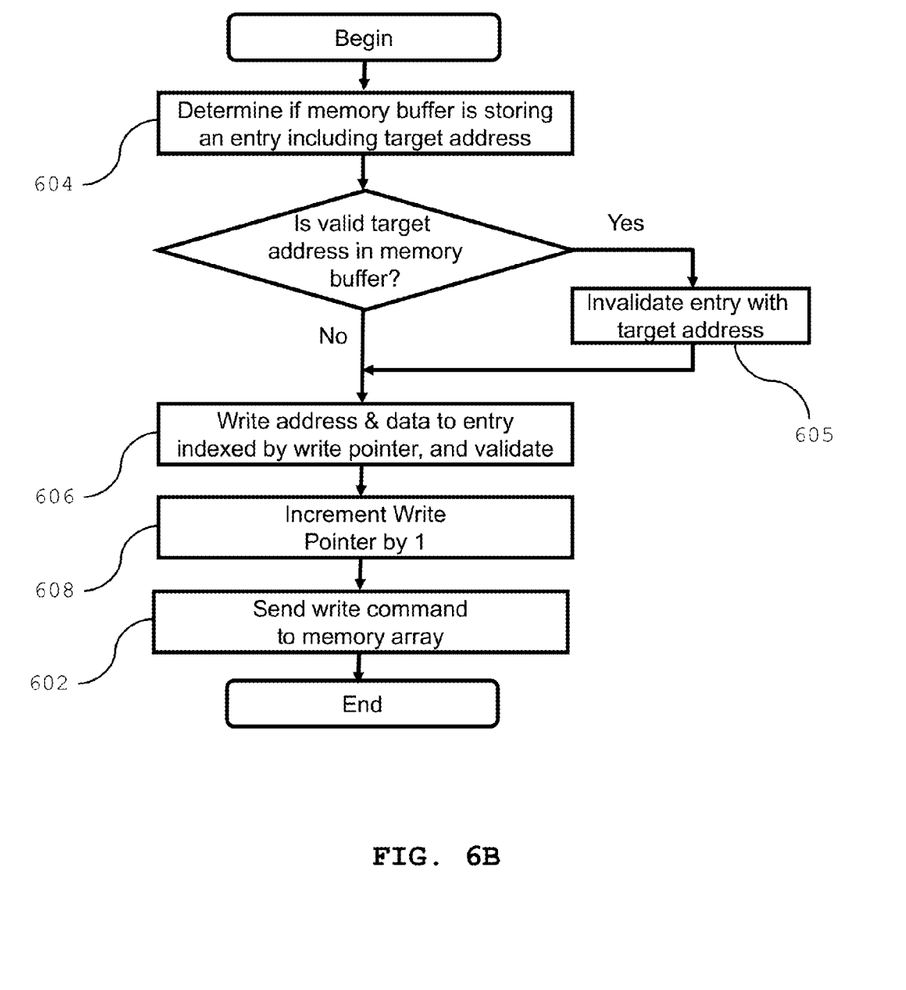
FIG. 6B is flowchart illustrating another method for writing data in a memory device according to one embodiment of the present invention.

FIG. 6B is flowchart illustrating another method for writing data in a memory device according to one embodiment of the present invention. In this embodiment, sending step 602 is performed after incrementing step 608.

Figure 6C:
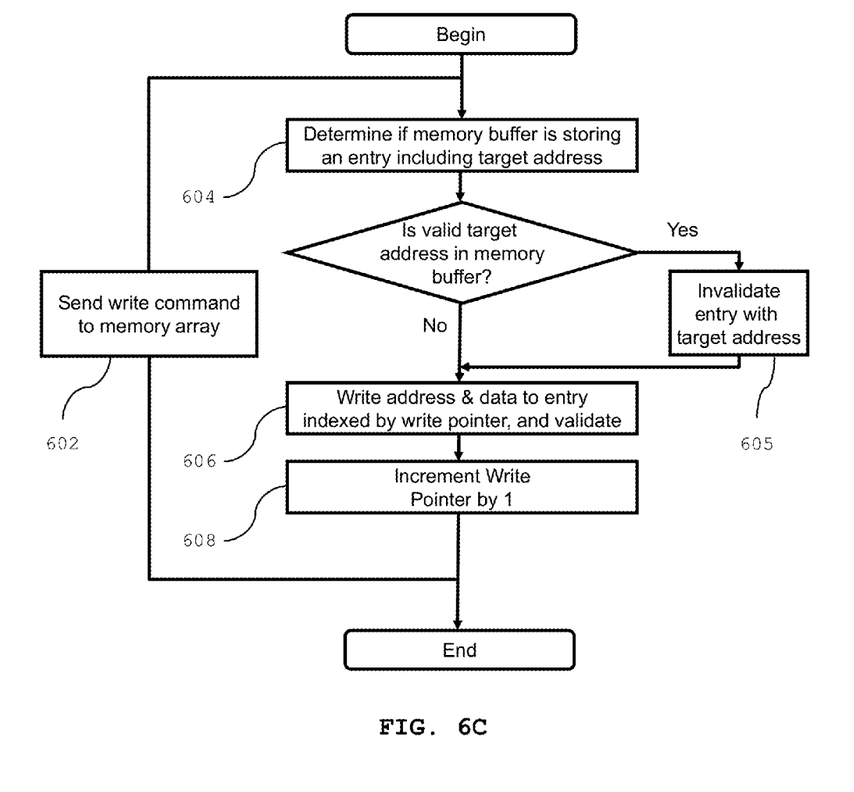
FIG. 6C is flowchart illustrating another method for writing data in a memory device according to one embodiment of the present invention.

FIG. 6C is flowchart illustrating yet another method for writing data in a memory device according to one embodiment of the present invention. In this embodiment, sending step 602 is performed in parallel with steps 604-608.

Figure 7:
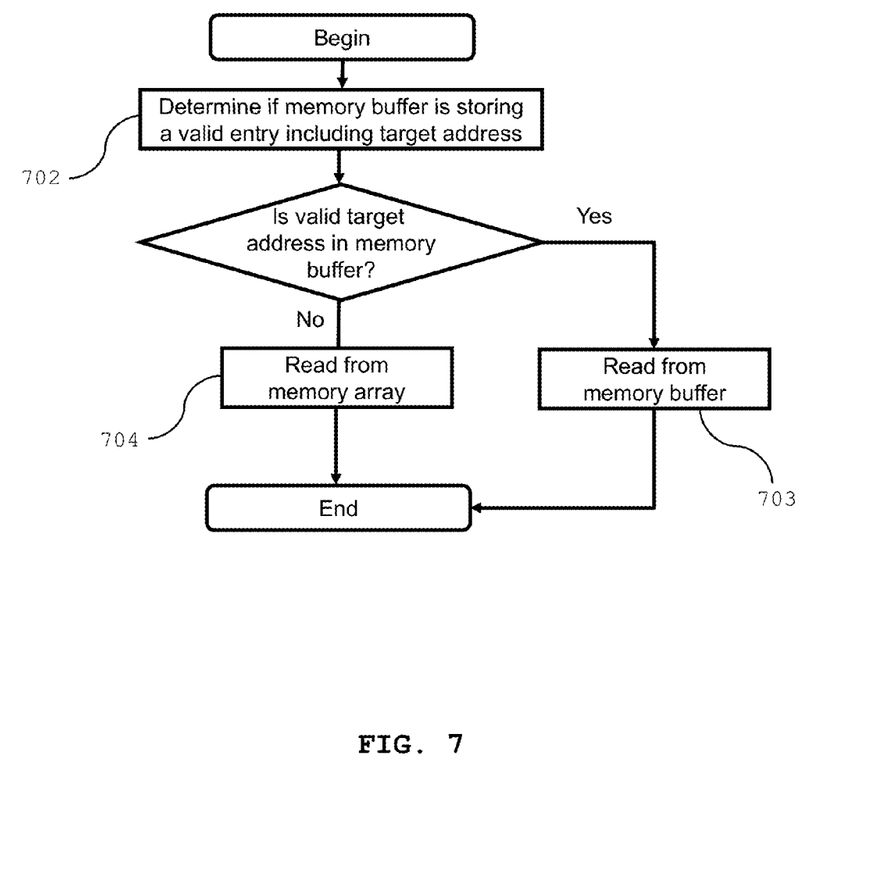
FIG. 7 is a flowchart illustrating a method for reading data in a memory device according to one embodiment of the present invention.

FIG. 7 is a flowchart illustrating a method for reading data in a memory device according to one embodiment of the present invention. The method begins with determining step 702. At determining step 702, the memory controller 106 determines if the memory buffer 104 is storing an entry that includes the target address and is marked valid. If a valid entry including the target address exists in the memory buffer 104, the method continues to reading step 703.

At reading step 703, the data is read from the memory buffer entry that includes the target address. After reading step 703, the data from the buffer is returned on a data bus.

If, at determining step 702, there were no entries in the memory buffer 104 that included the target address, or the target address exists only as an invalid entry in the memory buffer 104, the method continues to reading step 704. At reading step 704, the target data is read from the memory array 102. After reading step 704, data from the memory array is returned on a data bus.

In such an embodiment, data will not be read from the memory array 102 if the amount of time passed since it has been written at the memory array 102 is less than the premature read protection time (tPRP). Instead, it is read from the memory buffer 104. Accordingly, the memory buffer 104 may consist of memory technology that is less prone to drift than the memory technology of the memory array 102. For example, the memory array 102 may be configured with a MLC scheme and the memory buffer 104 may be configured with a SLC scheme. Other examples include, but are not limited to, a memory array 102 comprised of PCM, Metal-Oxide PRAM, CBRAM, or MRAM memory cells, and a memory buffer 104 comprised of SRAM or DRAM memory.

The memory array 102 may include array read thresholds for sensing the memory state of the memory cells in the memory array 102. The memory device 100 may also include buffer read thresholds different from the corresponding array read thresholds on the memory array 102. The difference between corresponding array read thresholds and buffer read thresholds may be based on the direction and amount of drift of the electrical characteristic utilized for storing the memory state. For example, with PCM arrays that experience increasing resistance over time, the memory device 100 may be configured such that certain buffer read thresholds are set to lower resistance levels than their corresponding array read thresholds. The difference in thresholds may be based, in part, on the resistance drift model: $R(t)=R_0*(t/t_0)^\gamma$. In embodiments wherein the memory cells only experience significant drift in one memory state, the thresholds may be configured only to compensate for one memory state prone to drift.

In some embodiments, the memory controller 106 is configured to invalidate all entries on the memory buffer 104 during initialization/power-on. As such, if data is read before any write operations after initialization, it will be read from the memory array 102 instead of the memory buffer 104. This configuration is preferred when the memory array 102 is comprised of memory technology that has better data retention than the memory buffer 104.

As mentioned above, the memory array 102 may be configured with a write-verify scheme to ensure data written to the memory array 102 has the correct electrical characteristic values before ending write operations.

Figure 8:
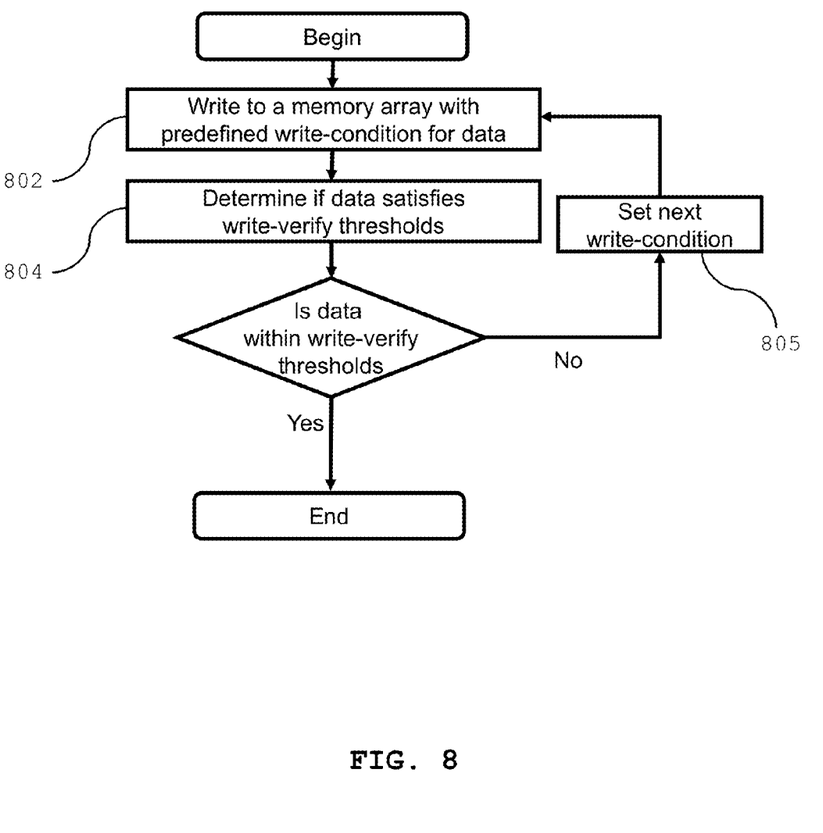
FIG. 8 is a flowchart illustrating a method for write-verify operations in a memory array according to one embodiment of the present invention.

FIG. 8 is a flowchart illustrating a method for write-verify operations in a memory array according to one embodiment of the present invention. The method begins with writing step 802. At writing step 802, data is written to the memory array 102 using predefined write-conditions based on the data being written. After writing step 802, the method continues to determining step 804. At determining step 804, the written data is read and it is determined whether the written data satisfies write-verify thresholds based on the data being written.

If the data is not within the correlating write-verify thresholds, the method proceeds to setting step 805. At setting step 805, the write-conditions may be modified based on the deviation of the written data from the write-verify thresholds. The write-conditions may include, but are not limited to, programming current and programming pulse duration.

For example, if, at determining step 804, the resistance of a written PCM cell is lower than the corresponding write-verify threshold after a first write, the programming current may be increased for a second write. After setting step 805, the method proceeds back to writing step 802 with new write-conditions.

In some embodiments, the predefined write-conditions are not modified, and the data is rewritten with the same write-conditions until the data satisfies the write-verify thresholds. However, if at determining step 804, the data satisfies the write-verify thresholds, the method is complete.

Figure 9:
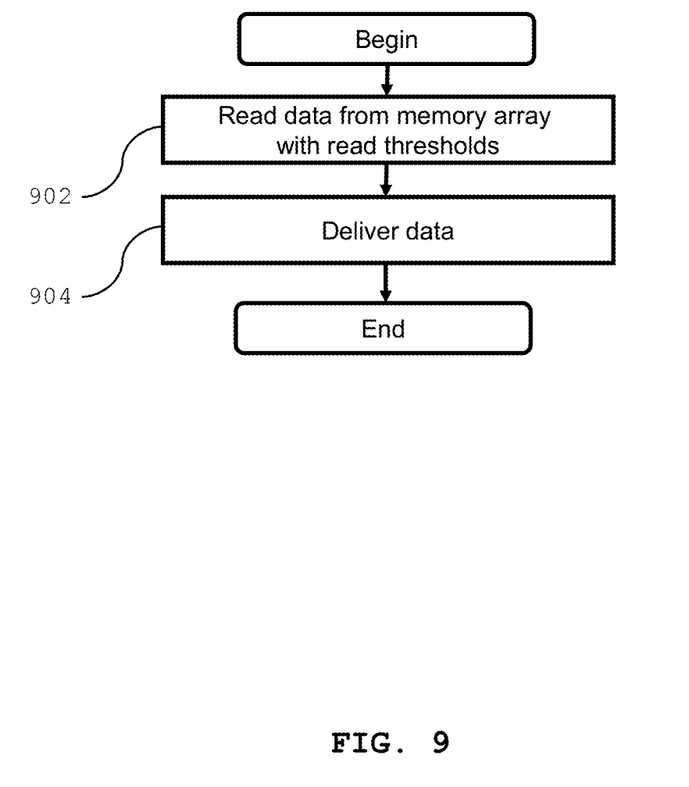
FIG. 9 is a flowchart illustrating a method for read operations in a memory array according to one embodiment of the present invention.

FIG. 9 is a flowchart illustrating a method for read operations in a memory array according to one embodiment of the present invention. The method begins with reading step 902. At reading step 902, the data is read utilizing array read thresholds. After reading step 902, the method continues to delivering step 904. At delivering step 904, the read data is delivered to the necessary location or device. After delivering step 904, the method is complete. It should be noted that in an embodiment with a write-verify scheme, the write-verify thresholds may be different from the correlating read thresholds. Since writing and verification occurs in a time interval shorter than tPRP, the write-verify thresholds may be different from the array read thresholds, in order to optimize timing and accuracy of the memory array operations. In one embodiment, where the memory array 102 is a PCM array, to account for resistance drift, the write-verify thresholds are set lower than the correlating array read thresholds.

In one embodiment, both the memory array 102 and memory buffer 104 are comprised of the same memory technology (e.g. both MLC PCM), or memory technology with similar drifting characteristics. In such an embodiment, the memory array 102 includes array read thresholds that are different from the corresponding buffer read thresholds for the memory buffer 104. Accordingly, in such embodiments, the memory controller 106 may be configured to invalidate entries in the memory buffer 104 after they have been written for tPRP. This can be achieved by including a clock in the memory controller 106 to invalidate entries after a predetermined number of write-cycles after being written to the memory buffer 104. In one embodiment, incrementing step 608 is followed by another invalidation operation while incrementing write pointer 510 to a next entry at every cycle with minimum write-cycle-time even when nothing is written at the cycle.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device including:
a memory array configured to store data, the memory array includes a plurality of memory cells;
a memory buffer configured to store the data in the memory array; and
a memory controller configured to read the data from the memory buffer if the data was written to the memory array before a predetermined duration of time, and to read the data from the memory array if the data is at least one of not valid or not available at the memory buffer.

2. The memory device of claim 1, wherein the memory buffer size is based on an amount of drift over time of an electrical characteristic of the memory array.

3. The memory device of claim 2, wherein the memory array includes a plurality of phase change memory cells and wherein the electrical characteristic of the memory array is resistance.

4. The memory device of claim 2, wherein the memory array is one of metal oxide resistive switching random access memory (Metal-Oxide PRAM), conductive bridge memory (CBRAM), and magnetic random access memory (MRAM), and wherein the electrical characteristic of the memory array is resistance.

5. The memory device of claim 1, further comprising:
wherein the memory buffer includes a plurality of entries and a write pointer, the write pointer identifying a current entry in the memory buffer to write the data; and
wherein each entry of the plurality of entries includes an address at the memory array where the data is stored, data stored at the address, and a validation bit indicating if the data is valid.

6. The memory device of claim 1, wherein the memory buffer is a circular buffer.

7. The memory device of claim 1, wherein the memory controller is further configured to:
send a write command to the memory array, the write command includes a target data to a target address;
determine if the memory buffer is storing an prior entry including the target address;
invalidate the prior entry including the target address;
write a current entry in the memory buffer, the current entry referenced by the write pointer, the current entry including the target data and the target address;
indicate the current entry as valid; and
increment the write pointer to a next entry.

8. The memory device of claim 7, wherein the memory controller indicates all entries in the memory buffer are invalid when the memory device is initialized.

9. The memory device of claim 1, wherein the memory device is further configured to:
write the data to the memory array;
read the data from the memory array before the predetermined duration of time;
determine if the data satisfies a write-verify threshold, the write-verify threshold for sensing a memory state of a memory cell in the memory array before expiration of the predetermined duration of time; and
rewrite the data until the data satisfies the write-verify threshold if the data does not satisfy the write-verify threshold.

10. The memory device of claim 9, wherein the write-verify threshold is less than a read threshold, the read threshold for sensing the memory state of the memory cell in the memory array after expiration of the predetermined duration of time.

11. The memory device of claim 1, wherein each cell in the memory array stores at least a two digit binary value, and each cell in the memory buffer stores a single digit binary value.

12. A method for operating a memory device including:
writing data to a memory array and a memory buffer, the memory array configured to store data and the memory buffer configured to store a subset of the data in the memory array;
reading data from the memory buffer if the data was written to the memory array before a predetermined duration of time; and
reading data from the memory array if the data is at least one of not valid and not available at the memory buffer.

13. The method of claim 12, wherein the memory buffer size is based on an amount of drift over time of an electrical characteristic of the memory array.

14. The method of claim 13, wherein the memory array includes a plurality of phase change memory cells and wherein the electrical characteristic of the memory array is resistance.

15. The method of claim 12, wherein the memory buffer includes a plurality of entries and a write pointer, the write pointer identifying a current entry in the memory buffer to write data from the memory array, and wherein each entry of the plurality of entries includes an address at the memory array, the data stored at the address, and a validation bit indicating if the entry contains valid information.

16. The method of claim 15, further comprising:
sending a write command to the memory array, the write command includes writing a target data to a target address;
determining if the memory buffer is storing an entry including the target address;
invalidating the entry including the target address if the memory buffer is storing an entry including the target address; and
writing the target data and the target address to the current entry in the memory buffer, indicate the target entry as valid and increment the write pointer to a next entry.

17. The method of claim 16, wherein the method further comprises invalidating all entries in the memory buffer when the memory device is initialized.

18. The method of claim 12, further comprising:
writing a data to the memory array;
reading the data from the memory array before the predetermined duration of time;
determining if the data satisfies a write-verify threshold, the write-verify threshold for sensing a memory state of a memory cell in the memory array; and
rewriting the data until the data satisfies the write-verify threshold if the data does not satisfy the write-verify threshold.

19. The method of claim 18, wherein the write-verify threshold is less than a read threshold, the read threshold for sensing a memory state of a memory cell in the memory array.

20. The method of claim 12, wherein each cell in the memory array stores at least a two digit binary value, and each cell in the memory buffer stores a single digit binary value.

* * * * *